April 14, 1970 F. V. ALIMENA 3,506,942

SELF-LOCKING CONTACT

Filed Oct. 19, 1967

INVENTOR.
Frank V. Alimena

BY

Pennie, Edmonds, Morton, Taylor & Adams

ATTORNEYS 3,506,942

SELF-LOCKING CONTACT

Frank V. Alimena, Port Chester, N.Y., assignor to Spacetec Research and Development, Inc., Port Chester, N.Y., a corporation of New York Filed Oct. 19, 1967, Ser. No. 676,395
Int. Cl. H05k *1/18*
U.S. Cl. 339—17 6 Claims

ABSTRACT OF THE DISCLOSURE

A self-locking, one-piece insert for printed circuit boards is disclosed. The self-locking insert is provided with radial contact members for contacting the printed circuitry of the board and with inwardly extending spring contact members which together establish a secure electrical connection between the printed circuitry on the surface of the board and electronic components mounted on the board.

BACKGROUND OF THE INVENTION

Electrical components (for example, transistors, resistors, capacitors, and the like) of printed electronic circuits are normally mounted on the printed circuit board by inserting the wire leads of the component through small holes drilled or punched in the board and then soldering the leads to the circuitry printed on the surface of the board. Alternatively, the wire leads of the components are soldered directly to the printed circuitry without inserting the wire lead into a hole formed in the board. The necessity for soldering the electric components to the printed circuitry on the facing or opposite surface of the board is time consuming, relatively costly and can lead to defects in the resulting electronic circuitry due to faulty soldering by the worker assembling the board.

SUMMARY OF THE INVENTION

After an intensive investigation of the problems associated with the manufacture of printed circuit boards, I have devised a one-piece, self-locking insert for printed circuit boards which provides a secure, spring-loaded electric contact between the printed circuitry of the board and electrical components mounted thereon. The one-piece, spring-loaded electric contact, self-locking insert of my invention comprises a cylindrical main body of springy sheet metal that is adapted to be inserted in a cylindrical hole of substantially the same diameter formed in a printed circuit board. The insert is provided with at least two integrally formed radial contact members that extend outwardly from the top peripheral edge of the main body, and with at least two outwardly extending spring-loaded latching members that are formed in the cylindrical main body adjacent the bottom edge thereof. At least one inwardly extending spring-loaded electric contact member is formed in the wall of the cylindrical main body intermediate the top and bottom edges thereof.

When the cylindrical main body of the insert is inserted bottom edge first into a hole of approximately the same size formed in a printed circuit board, the outwardly extending latching members are first forced inwardly against the cylindrical main body by the contacting surfaces of the hole in the board, and then, as the bottom edge emerges from the hole on the opposite side of the board, the latching members spring outwardly again to prevent withdrawal of the insert from the hole. The radial contact members and the upper or "latching" edges of the spring-loaded latching members are spaced apart a distance approximately equal to the thickness of the circuit board with which the insert is to be used. Therefore, when the insert is inserted in the board, the radial contact members at the top edge of the insert contact one surface of the board and the spring-loaded latching members adjacent the bottom edge contact the opposite surface of the board. At least one surface of the board is provided with printed circuitry through which the insert extends, the radial contact members (and in some cases, the spring latching members) contacting this printed circuitry to form an electrical connection therewith. The wire lead of an electric component of the circuit is then inserted into the cylindrical body of the insert, the wire lead being firmly contacted and held by the inwardly extending spring-loaded electric contact members of the insert. As a result, a secure electrical connection is established between the printed circuitry and the electric component of the circuit that is mounted on the board.

BRIEF DESCRIPTION OF THE DRAWINGS

The self-locking insert of my invention will be better understood from the following description thereof in conjunction with the accompanying drawings of which.

DETAILED DESCRIPTION

Figures 1A, 2:
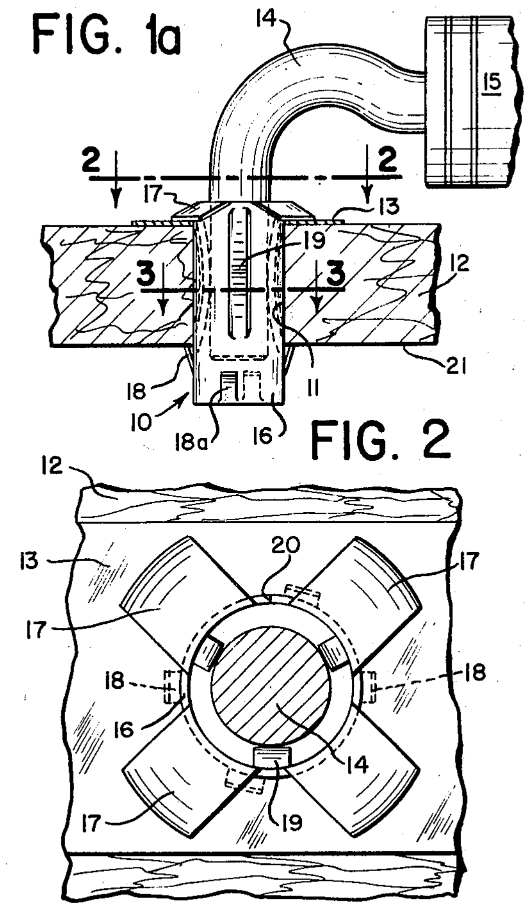
FIG. 1*a* is a fragmentary view, partly in section, of a printed circuit board provided with an advantageous embodiment of the self-locking insert for an electric component of the circuit in accordance with my invention.
FIG. 2 is an enlarged sectional view along lines 2—2 of FIG. 1*a*.

As shown best in FIG. 1*a*, the self-locking insert 10 of my invention is designed to be inserted in a hole 11 formed in a printed circuit board 12, the insert 10 providing a secure electrical connection between the printed circuitry 13 on one surface of the board 12 and the wire lead 14 of an electrical component 15 mounted on the board. The insert 10 is formed in one piece from springy sheet metal such as sheet brass or beryllium copper, and it comprises a cylindrical main body 16 the diameter of which is substantially the same as the diameter of the hole 11 in which the insert is placed. The upper edge of the cylindrical main body 16 of the insert is formed with a plurality of radial contact members 17 which extend outwardly and preferably slightly downwardly as shown best in FIGS. 1*a* and 4. The cylindrical main body 16 is also provided with a plurality of outwardly extending spring-loaded latching members 18 that are formed in the wall of the main body adjacent the bottom edge thereof, and with a plurality of inwardly extending spring-loaded electric contact members 19 that are formed in the wall of the main body 16 between the radial contact members 17 at the upper edge and the latching members 18 adjacent the lower edge of the insert.

Figure 3:
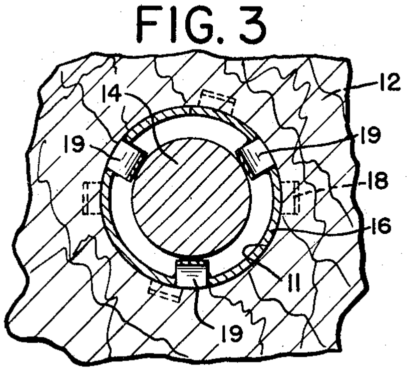
FIG. 3 is an enlarged sectional view along lines 3—3 of FIG. 1*a*.
Figure 4:
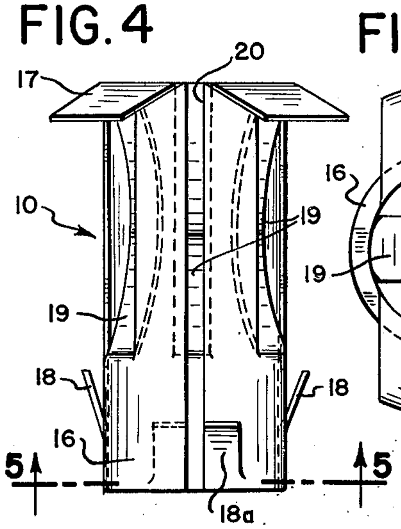
FIG. 4 is an enlarged side view of the advantageous embodiment of the insert shown in FIG. 1*a*.
Figure 5:
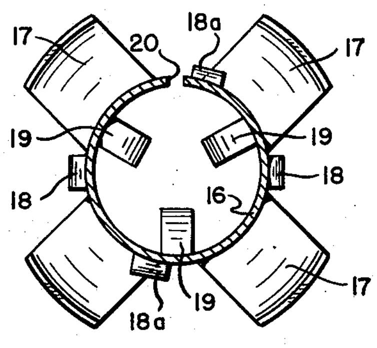
FIG. 5 is a sectional view along lines 5—5 of FIG. 4.

As noted, the insert 10 is advantageously formed in one piece from springy sheet metal, the various structural elements 17, 18 and 19 being formed in a stamping operation carried out on a flat sheet or blank of the sheet metal. The flat blank is then formed into a cylindrical shape (the main body 16) having a slit 20 the vertical edges of which advantageously do not quite contact each other as shown in FIG. 4. The diameter of the cylindrical main body 16 of the insert 10 shown in FIGS. 4 and 5 is advantageously slightly larger than that of the hole 11 into which it is to be inserted so that the vertical edges of the slit 20 must be pressed together as shown in FIGS. 2 and 3 in order to place the insert in the hole. When the cylindrical body 16 is inserted bottom edge first into the hole, the outwardly extending latching members 18 are pressed inwardly substantially flush with the side wall of the main body 16 by the contacting inner surface of the hole into which the insert is being placed. When the lower end of the main body of the insert emerges from the hole, the spring-loaded latching members 18 then spring outwardly and catch against the under surface 21 of the printed circuit board 12 as shown in FIG. 1*a*.

Figure 1B:
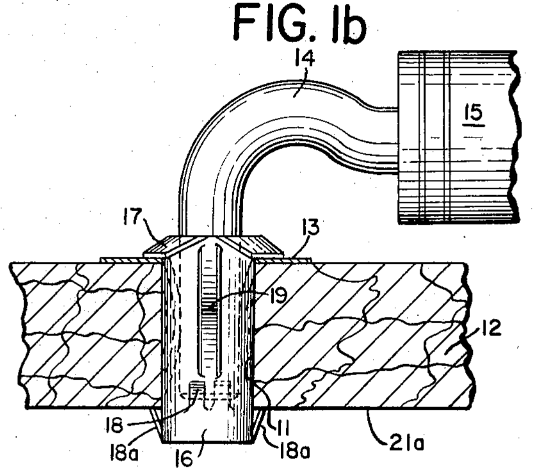
FIG. 1*b* is a fragmentary view similar to FIG. 1*a* showing the self-locking insert of the invention in connection with a circuit board of greater thickness than that shown in FIG. 1*a*.

As noted, the latching members 18 spring outwardly when the insert 10 is fully inserted in the hole 11 of the printed circuit board 12, and they are designed to hold the insert in this position with the radial contact members 17 in firm electrical contact with the printed circuit 13 on the top surface of the board. The printed circuit board 12 is normally of a predetermined standard thickness, and the spacing between the radial contact members 17 and the spring loaded latching members 18 is determined by this thickness of the board. If the insert 10 is to be used only with a board of a certain predetermined thickness, the spacing between the contact members 17 and the latching members 18 is more or less fixed, and only two latching members 18 need be provided (although more may be provided, if desired). However, in the embodiment of the invention shown in the drawings, the insert 10 is designed to be employed with printed circuit boards 12 of either of two predetermined, standard thicknesses, and to this end pairs of outwardly extending latching members 18 and **18*a* are located at two different distances from the radial contact members 17**. Thus, as shown in FIG. 1*a* the pair of latching members 18 are designed to latch onto the under surface 21 of the thinner of the two boards 12, and as shown in FIG. 1*b* the pair of latching members **18*a* are designed to latch onto the under surface 21*a*** of the thicker of the two boards with which the insert is designed to be used.

The inwardly extending electric contact members 19 of the insert 10 are advantageously inwardly bowed elements integrally formed in the side wall of the cylindrical main body 16. The contact members 19 extend inwardly a distance such that the space between the facing inner surfaces of these members is less than the space required by the cross section of the wire lead 14 to be inserted thereinto. As a result, when the wire lead 14 of the electric component 15 is pressed into the insert 10, the wire lead compresses or forces the springy, inwardly bowed contact members 19 outwardly toward the wall of the cylindrical main body of the insert 10 as shown best in FIGS. 2 and 3. The compressive and frictional forces exerted by the spring-loaded contact members 19 against the wire lead 14 establishes a good electrical connection between these parts and, at the same time, holds the wire lead firmly in place within the insert 10.

In the embodiment of my invention shown in FIG. 1*a* of the drawing, the upper surface of the board 12 is provided with printed circuitry 13 through which the insert 10 extends. The springy, slightly downwardly turned, radial contact members 17 establishes a good electrical contact with the printed circuit 13, and, as noted, the inwardly extending electric contact members 19 establish a good electrical contact with the wire lead 14 of the electric component 15. In other embodiments of my invention, the under surface of the board 12 may also be provided wtih printed circuitry in which case the electrical connection between the printed circuit and the insert 10 (and hence the wire lead 14) is established by the latching members 18.

Figure 6:
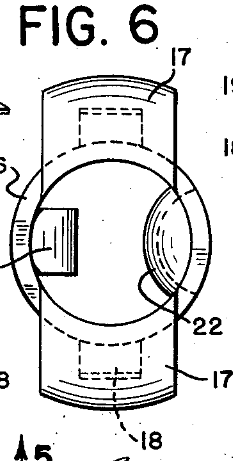
FIG. 6 is a plan view of another embodiment of the insert of my invention.

In the embodiment of my invention shown in FIGS. 1–5 of the drawings, the insert 10 is provided with four radial contact members 17. However, it is obvious that the insert 10 can be provided with two such radial contact members 17 as shown in FIG. 6, or with three or more such contact members as circumstances warrant. Similarly, in the embodiment shown in FIGS. 1–5, the insert 10 is provided with three inwardly extending electric contact members 19. However, it is obvious that the cylindrical main body 16 can be formed with only one such inwardly bowed contact member as shown in FIG. 6. Moreover, the inwardly bowed, spring-loaded, contact member 19 can be employed in conjunction with an inwardly extending dimple 22 embossed or otherwise formed in the side wall of the cylindical main body 16 of the insert.

I claim:

1. A one-piece, spring-loaded electric contact, self-locking insert for printed circuit boards which comprises:

an open-ended cylindrical main body of springy sheet metal adapted to be inserted in a cylindrical hole formed in a printed circuit board, at least two integrally formed radial contact members extending outwardly and slightly downwardly from the top peripheral edge of the cylindrical main body.

at least two outwardly extending spring-loaded latching members formed in the cylindrical main body adjacent the bottom edge thereof, and at least one inwardly extending spring-loaded electric contact member formed in the wall of the cylindrical main body intermediate the top and bottom edges thereof.

2. The insert according to claim 1 in which the cylindrical main body, radial contact members, spring-loaded latching members and spring-loaded electric contact members are integrally formed from one-piece of springy sheet metal.

3. The insert according to claim 1 in which the cylindrical main body is provided with a vertical slit.

4. The insert according to claim 1 in which the cylindrical main body is formed with at least two pairs of spring-loaded latching members, the latching members of one pair being spaced from the radial contact members a distance substantially equal to the thickness of a printed circuit board of one predetermined thickness and the latching members of the second pair being spaced from the radial contact members a distance substantially equal to the thickness of a printed circuit board of a second predetermined thickness.

5. The insert according to claim 1 in which the spring-loaded electric contact members are integrally formed inwardly bowed elements.

6. The insert according to claim 1 in which the side wall of the cylindrical main body is formed with an inwardly protruding dimple positioned opposite a spring-loaded electric contact member.

References Cited

UNITED STATES PATENTS

| | | | |
|---|---|---|---|
| 840,537 | 1/1907 | Weir. | |
| 2,229,996 | 1/1941 | Churchill | 85—5 |
| 2,391,298 | 12/1945 | Davis | 85—5 |
| 2,560,530 | 7/1951 | Burdick | 85—5 |
| 2,742,636 | 4/1956 | Alden | 339—128 XR |
| 3,208,028 | 9/1965 | Mittler et al. | |
| 3,421,135 | 1/1969 | Soltysik et al. | |

FOREIGN PATENTS 1,345,456 10/1963 France.

MARVIN A. CHAMPION, Primary Examiner

P. A. CLIFFORD, Assistant Examiner

U.S. Cl. X.R.

85—5; 339—217, 256